United States Patent [19]

Taka et al.

[11] Patent Number: 4,975,381
[45] Date of Patent: Dec. 4, 1990

[54] METHOD OF MANUFACTURING SUPER SELF-ALIGNMENT TECHNOLOGY BIPOLAR TRANSISTOR

[75] Inventors: Shin-ichi Taka, Yokosuka; Jiro Ohshima, Kitakyushu, both of Japan

[73] Assignee: Kabushiki Kaisha Toshiba, Kawasaki, Japan

[21] Appl. No.: 492,488

[22] Filed: Mar. 12, 1990

[30] Foreign Application Priority Data

Mar. 13, 1989 [JP] Japan ................................. 1-60050

[51] Int. Cl.$^5$ ........................................ H01L 21/265
[52] U.S. Cl. ........................................ 437/31; 437/33; 437/162; 437/909; 148/DIG. 11; 148/DIG. 124; 357/34; 357/59
[58] Field of Search ............... 437/31, 162, 33, 909; 148/DIG. 11, DIG. 124; 357/34, 59 H

[56] References Cited

U.S. PATENT DOCUMENTS

| | | | |
|---|---|---|---|
| 4,675,983 | 6/1987 | Uehara | 437/33 |
| 4,818,713 | 4/1989 | Feygenson | 437/90 |
| 4,824,794 | 4/1989 | Tabata et al. | 437/33 |
| 4,892,837 | 1/1990 | Kudo | 437/31 |

FOREIGN PATENT DOCUMENTS

60-81862 10/1983 Japan.

*Primary Examiner*—Brian E. Hearn
*Assistant Examiner*—Tuan Nguyen
*Attorney, Agent, or Firm*—Finnegan, Henderson, Farabow, Garrett and Dunner

[57] ABSTRACT

This invention discloses a method of manufacturing an SST bipolar transistor, and the manufacturing method is capable of defining the size of a base region of the SST bipolar transistor. An insulating film and a spacer film serving as a spacer are sequentially formed in a bipolar transistor forming region on the main surface of a semiconductor substrate. Thereafter, the spacer film is patterned into a spacer film pattern for defining the size of the base region. A second insulating film, a base electrode pattern and a third insulating film are sequentially formed on the spacer film pattern. A first opening which reaches the spacer film pattern through the second insulating film, the base electrode pattern and the third insulating film is formed. The spacer film pattern is etched from the first opening to form a second opening having a diameter larger than that of the first opening. The insulating film exposed in the second opening is etched. The size of the base region on the major surface of the semiconductor substrate is defined by the size of the second opening.

7 Claims, 7 Drawing Sheets

METHOD OF MANUFACTURING SUPER SELF-ALIGNMENT TECHNOLOGY BIPOLAR TRANSISTOR

BACKGROUND OF THE INVENTION

1. Field of the Invention

The present invention relates to a method of manufacturing a super self-alignment technology bipolar transistor and, more particularly, a manufacturing method capable of defining a size of a base region of a super self-alignment technology bipolar transistor.

2. Description of the Related Art

A method of manufacturing a super self-alignment technology bipolar transistor is disclosed in the specification and drawings of Published Unexamined Japanese Patent Application No. 60-81862.

According to the disclosed prior art, there is provided a micropatterned bipolar transistor having a width of about 0.5 µm of an emitter, a width of about 0.3 µm of an insulating film for insulating the emitter from a base contact and a width of about 0.3 µm of the base contact by a lithographic technique having a minimum size of 2 µm. A bipolar transistor of this type is referred to as a super self-alignment technology bipolar transistor. In this specification, the super self-alignment technology bipolar transistor is referred to as an SST bipolar transistor hereinafter.

In a method of manufacturing an SST bipolar transistor disclosed in the specification and drawings of Published Unexamined Japanese Patent Application No. 60-81862, formation of a base region has the following characteristics.

A first $SiO_2$ film is formed on a prospective bipolar transistor forming region of a major surface of an Si substrate. An $Si_3N_4$ film having a thickness of about 1,500 Å is formed on the first $SiO_2$ layer. A first poly-Si film prospectively serving as a base electrode is formed on the $Si_3N_4$ film. An opening is formed in the first poly-Si film using lithographic techniques to expose the $Si_3N_4$ film. An emitter electrode is prospectively formed in this opening. The surface of the first poly-Si film is oxidized to form a second $SiO_2$ film. The second $SiO_2$ film prospectively constitutes an insulating film for insulating an emitter from a base. The $Si_3N_4$ film is etched by hot $H_3PO_4$ using the first and second $SiO_2$ films as etching masks. At this time, the $Si_3N_4$ film located under the first poly-Si film is side-etched by about 0.7 µm. The etched portion including the side-etched portion prospectively defines a size of a base region. A second poly-Si film is formed on the etched portion including the side-etched portion. In this case, the poly-Si film contacts the Si substrate at the side-etched portion and is integrated with the above first poly-Si film to prospectively constitute an outer base contact portion.

In the method of manufacturing an SST bipolar transistor disclosed in the specification and drawings of Published Unexamined Japanese Patent Application No. 60-81862, a size of a base region on a major surface of the Si substrate is defined by a size of a portion where an $Si_3N_4$ film is etched and side-etched using an $SiO_2$ film as an etching mask from an opening formed using lithographic techniques.

In order to increase etching selectivity of the $Si_3N_4$ film to the $SiO_2$ film, wet-etching must be performed using hot $H_3PO_4$ as an etching solution. This hot $H_3PO_4$ is a viscous liquid, and its coefficient of viscosity is high. For this reason, bubbles are easily formed in a space formed between the Si substrate and the first poly-Si film when the first $Si_3N_4$ film having a thickness of about 1,000 to 1,500 Å is side-etched. When these bubbles are formed, the hot $H_3PO_4$ can no longer enter a region to be etched, thereby forming etching nonuniformity. For this reason, a size of a base region prospectively fomed is not uniformed. Therefore, the $Si_3N_4$ film serving as an insulator remains at the region where the outer base contact portion will be prospectively formed to increase the resistance of the region, and in an extreme case, the region is completely insulated by the $Si_3N_4$ film not to form the SST bipolar transistor. According to the above method of manufacturing an SST bipolar transistor, an element production probability can be estimated to be a maximum of 99.99%. With this production probability, for example, about 10 failed elements are present in a semiconductor device on which 100,000 SST bipolar transistors are integrated. That is, according to the above manufacturing method, the production probability of SST bipolar transistors, i.e., yield of elements is small, and a semiconductor device on which a large number of SST bipolar transistors are integrated cannot be provided. Even if the semiconductor device can be provided, it is very expensive.

In addition, in order to solve the problem of generating bubbles, it can be considered to perform dry etching of $Si_3N_4$ in place of wet etching. However, etching selectivity of the $Si_3N_4$ film to the $SiO_2$ film is small by using dry etching techniques at present. Therefore, since the $SiO_2$ film cannot be used as an etching mask for the $Si_3N_4$, the Si substrate is overetched and a hole may be formed in the Si substrate. For this reason, the $Si_3N_4$ film cannot be dry-etched in practice.

During manufacturing steps, an amount of etching is varied by variations in manufacturing atmosphere or variations in etching. Therefore, in the SST bipolar transistor manufactured in the above manufacturing method, a base region is not uniformed, thereby varying characteristics of elements.

SUMMARY OF THE INVENTION

The present invention has been made in consideration of the above problem, and has as its object to provide a method of manufacturing an SST bipolar transistor capable of obtaining a high yield and decreasing variations in characteristics of elements.

According to an aspect of the present invention, there is provided a manufacturing method comprising the steps of:

(a) forming a first insulating film in an SST bipolar transistor forming region on the major surface of a semiconductor body of a first conductivity type;

(b) forming a spacer film serving as a spacer on said first insulating film;

(c) etching said spacer film to form a spacer film pattern having a predetermined size;

(d) forming a second insulating film on said spacer film pattern;

(e) forming a first conductive film of a second conductivity type over the entire surface of said semiconductor body;

(f) etching said first conductive film to form a first conductive film pattern larger than said spacer film pattern above said spacer film pattern;

(g) forming a third insulating film over the entire surface of said semiconductor body;

(h) forming a first opening which reaches said spacer film pattern through said third insulating film, said first conductive film pattern and said second insulating film;

(i) forming a fourth insulating film over the entire surface of said semiconductor body;

(j) etching said fourth insulating film to form a first side wall constituted by said fourth insulating film around the side wall of said first opening;

(k) etching said spacer film pattern from said first opening to form a second opening communicating with said first opening and having a diameter larger than said first opening;

(l) etching said first and second insulating films from said first opening to expose parts of said first conductive film and the major surface to the inside of said second opening;

(m) forming second conductive film over the entire said semiconductor body including the inside of said second opening;

(n) etching a part of said second conductive film to form a third opening which corresponds to said first opening and reaches the major surface of said semiconductor body;

(o) forming a fifth insulating film on said first and second conductive films and said major surface each exposing the inside of said third opening;

(p) implanting an impurity of the second conductivity type from said third opening into said semiconductor body;

(q) forming a third conductive film over the entire surface of said semiconductor body;

(r) etching said third conductive film to form a second side wall constituted by said third conductive film around the side wall of said third opening;

(s) forming a fourth conductive film of the first conductivity type over the entire surface of said semiconductor body;

(t) activating base and emitter regions in said semiconductor body corresponding to said second opening;

(u) etching said fourth conductive film to form an emitter electrode pattern;

(v) forming a fourth opening which reaches said first conductive film through said third insulating film;

(w) forming a fifth conductive film over the entire surface of said semiconductor body; and (x) etching said fifth conductive film to form interconnection layers, wherein SST bipolar transistors having small variations in characteristics of its elements can be obtained at a high yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

[EMBODIMENT 1]

A method of manufacturing an SST bipolar transistor according to the first embodiment of the present invention will be described with reference to FIGS. 1A to 1R.

Figure 1A:
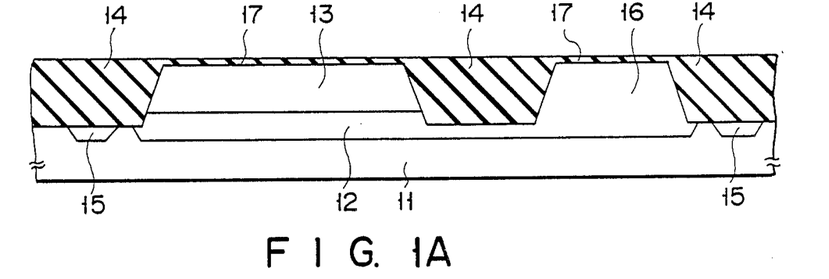
FIGS. 1A to 1R are sectional views showing sequential steps in manufacturing an SST bipolar transistor according to the first embodiment of the present invention.

As shown in FIG. 1A, a p-type Si substrate 11 having an impurity concentration of about $1 \times 10^{19}$ cm$^{-3}$ containing, e.g., boron is prepared. Antimony (Sb) ions are selectively implanted in the Si substrate 11 and diffused to form an n$^+$-type burying collector layer 12 having an impurity concentration of about $1 \times 10^{19}$ cm$^{-3}$. An epitaxial-Si layer is epitaxially grown on the entire surface of the Si substrate 11. Phosphorus (P) ions are selectively implanted in the epitaxial-Si layer and diffused to form an n-type epitaxial-Si layer 13 having an impurity concentration of about $1 \times 10^{16}$ cm$^{-3}$. In addition, an insulating film 14 made of a first SiO$_2$ film is formed on the major surface of the epitaxial-Si layer 13 using selective oxidation techniques (LOCOS). During formation of the insulating film 14, boron ions may be selectively implanted in a prospective insulating film 14 forming region in advance and diffused using heat generated during selective oxidation so as to form a p$^+$-type channel stopper 15 having an impurity concentration of about $1 \times 10^{19}$ cm$^{-3}$. Phosphorus ions are selectively implanted in a prospective collector outputting region and diffused to form an n$^+$-type collector outputting region 16 having an impurity concentration of about $1 \times 10^{19}$ cm$^{-3}$. A second SiO$_2$ film 17 having a thickness of about 500 Å is formed on a bipolar transistor forming region using, e.g., thermal oxidation.

Figure 1B:
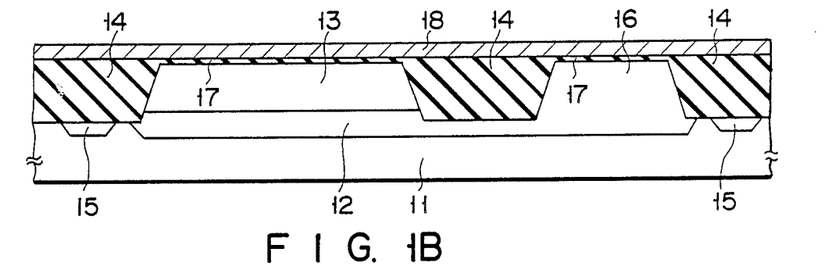

As shown in FIG. 1B, a first poly-Si film 18 having a thickness of 1,000 Å is formed on the entire surface of the insulating film 14 and second SiO$_2$ film 17 using, e.g., CVD. This poly-Si film 18 is prospectively used as a spacer for defining the size of a base region.

Note that an amorphous-Si film may be used as the poly-Si film 18.

Figure 1C:
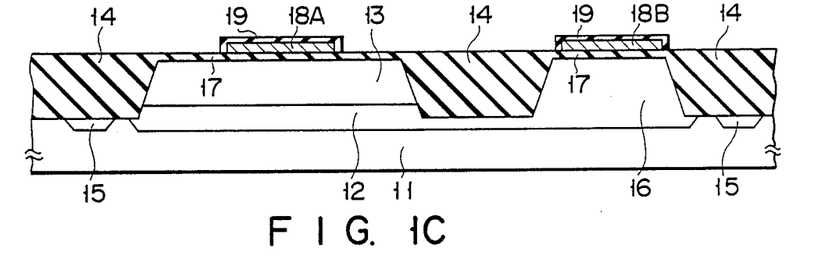

As shown in FIG. 1C, the poly-Si film 18 is patterned using lithographic techniques to form a spacer film pattern 18A for defining the size of the base region over the epitaxial-Si layer 13. At the same time, a spacer film pattern 18B is formed over the collector outputting region 16. Third SiO$_2$ films 19 having a thickness of about 500 Å are formed on the surfaces of the spacer film patterns 18A and 18B by e.g., thermal oxidation.

Figure 1D:
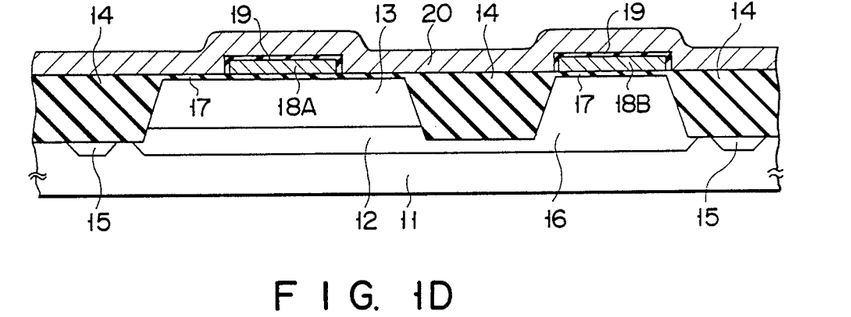

As shown in FIG. 1D, a second poly-Si film 20 having a thickness of about 3,000 Å is formed over on the entire surface of the substrate using, e.g., CVD. This poly-Si film 20 includes, e.g., boron (B) serving as an impurity for forming an outer base region.

Figure 1E:
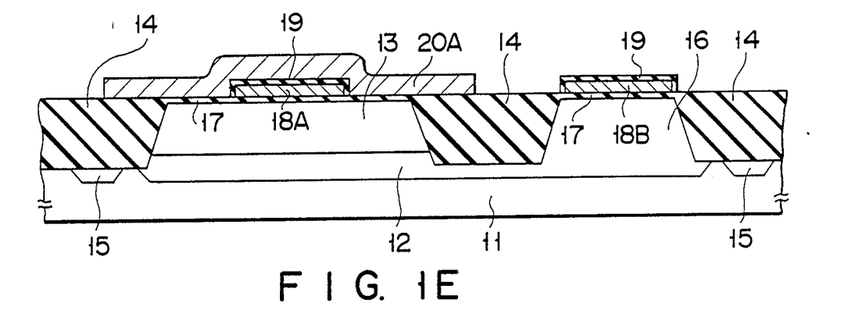

As shown in FIG. 1E, the poly-Si film 20 is patterned using lithographic techniques to form a base electrode pattern 20A for defining the shape of the base electrode.

Figure 1F:
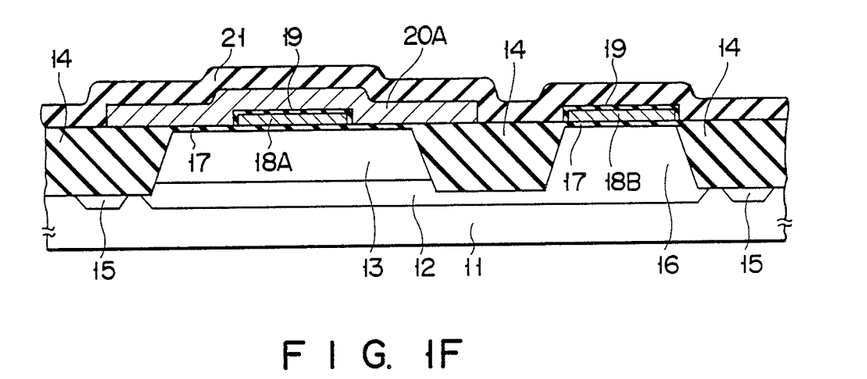

As shown in FIG. 1F, a fourth SiO₂ film 21 having a thickness of about 3,000 Å is formed over the entire surface of the substrate using, e.g., CVD.

Figure 1G:
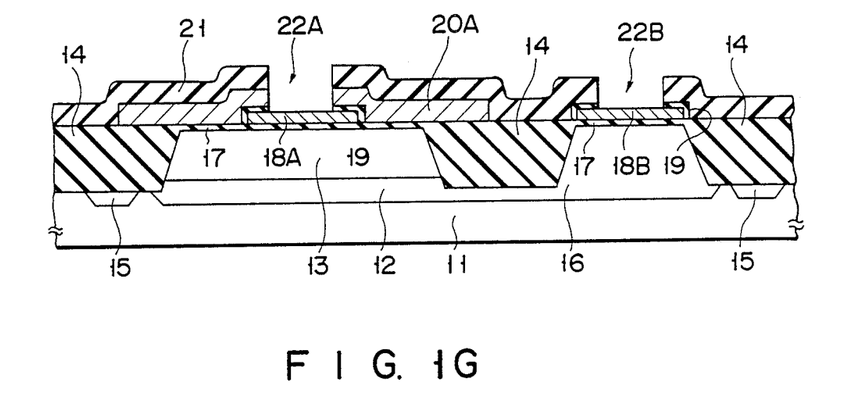

As shown in FIG. 1G, an opening 22A which reaches the spacer film pattern 18A through the fourth SiO₂ film 21, the base electrode pattern 20A, and the third SiO₂ film 19 is formed using lithographic techniques. An opening 22B which reaches the spacer film pattern 18B through the fourth SiO₂ film 21 and the third SiO₂ film 19 is formed using lithographic techniques. The openings 22A and 22B are formed using, e.g., anisotropic etching such as RIE.

Figure 1H:
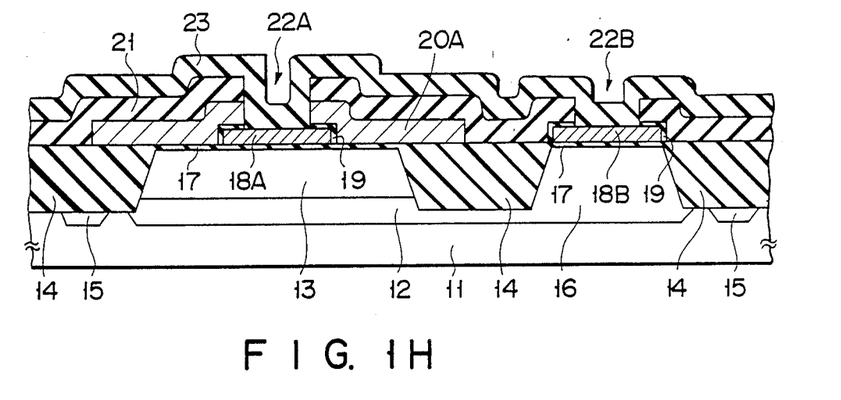

As shown in FIG. 1H, a fifth SiO₂ film 23 having a thickness of about 4,000 Å is formed over the entire surface of the substrate using, e.g., CVD.

Figure 1I:
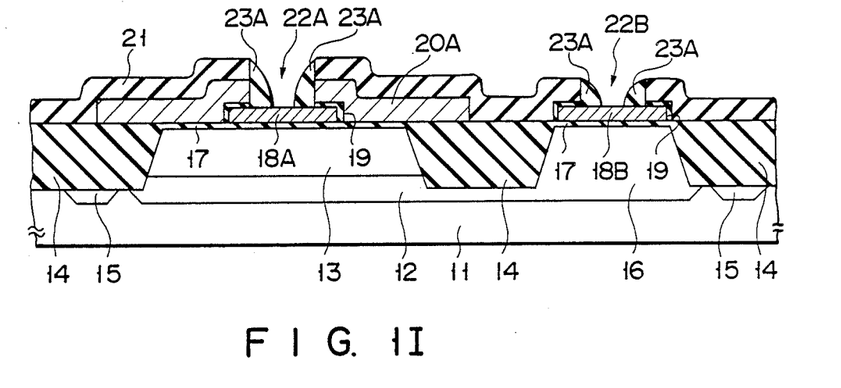

As shown in FIG. 1I, the fifth SiO₂ film 23 is etched back using, e.g., RIE to form side walls 23A made of the fifth SiO₂ film 23 around the side walls of the openings 22A and 22B. It is desirable to etch-back the fifth SiO₂ film 23 until when the spacer film patterns 18A and 18B are exposed. The side walls 23A are annealed, e.g., at a temperature of 950° C. for 30 minutes to be densified. This annealing is performed in order to preparatorily prevent the side walls 23A made of an SiO₂ film from being etched together with the second and third SiO₂ films 17 and 19.

Figure 1J:
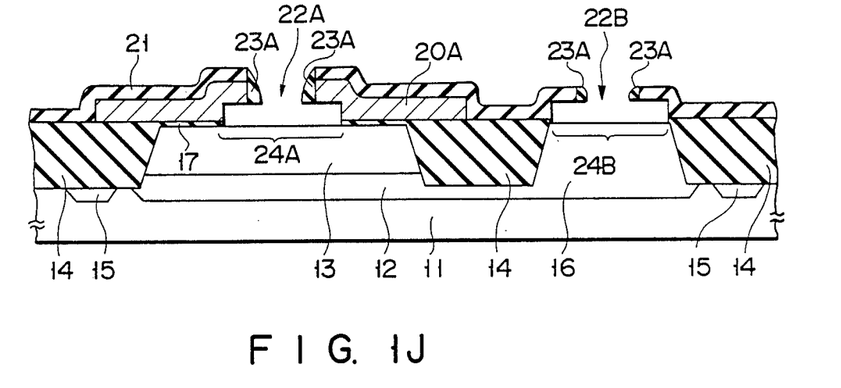

As shown in FIG. 1J, the spacer film patterns 18A and 18B are entirely etched from the openings 22A and 22B by dry etching using, e.g., a chlorine (Cl) gas or a gas mixture of fluorine (F) and chlorine (Cl). Thus, an opening 24A having a diameter larger than that of the opening 22A is formed. At the same time, an opening 24B having a diameter larger than that of the opening 22B is formed. The second and third SiO₂ films 17 and 19 are etched by wet etching using, e.g., hydrogen fluoride (HF). Therefore, the epitaxial-Si layer 13, the collector outputting region 16 and the base electrode pattern 20A are exposed particularly in the openings 24A and 24B.

Note that wet etching may be performed to the spacer film patterns 18A and 18B in place of dry etching. In the first embodiment of the present invention, the poly-Si film is etched using the SiO₂ film as an etching mask. Therefore, wet etching can be performed using a solution containing nitric acid (HNO₃) and hydrogen fluoride (HF). The solution containing nitric acid (HNO₃) and hydrogen fluoride (HF) has a low coefficient of viscosity, thereby reducing generation of bubbles.

Figure 1K:
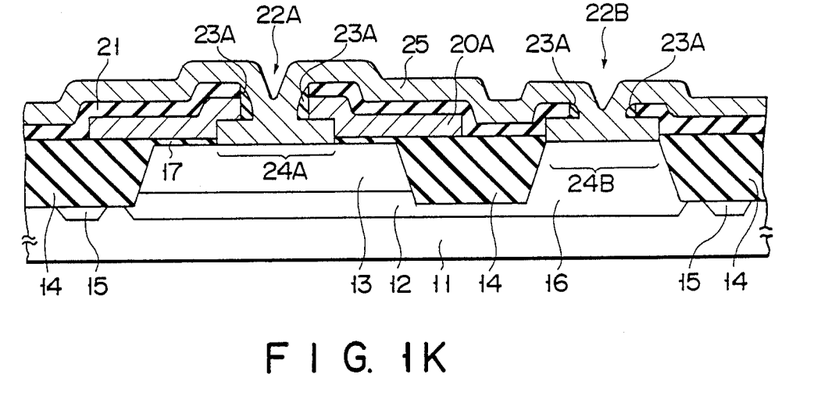

As shown in FIG. 1K, a third poly-Si film 25 having a thickness of about 3,000 Å is formed over the entire surface of the substrate using, e.g., LPCVD. At this time, in particularly, an opening 24A is buried with the third poly-Si film 25 by adjusting a pressure, a temperature and the like in the LPCVD. Thus, the base electrode pattern 20A is formed integrally with the third poly-Si film 25, and the resultant structure is electrically connected to the epitaxial-Si layer 13 in the subsequent process.

Note that the pressure, temperature and the like in the LPCVD are also desirably adjusted not to form a void in the poly-Si film 25 in the openings 22A and 22B.

Figure 1L:
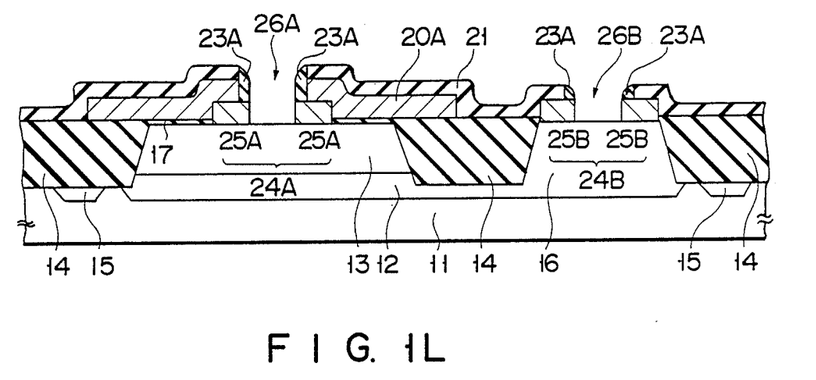

As shown in FIG. 1L, the third poly-Si film 25 is etched using, e.g., RIE to form the opening 26A which reaches the epitaxial-Si layer 13. At the same time, the opening 26B which reaches the collector outputting region 16 is formed. A part of the poly-Si film 25 remains under the base electrode pattern 20A in the opening 24A. The remaining poly-Si film 25 is used as a base contact portion 25A. At the same time, a poly-Si film 25B also remains in the opening 24B.

Note that the poly-Si film 25 may be etched using isotropic etching such as CDE.

Figure 1M:
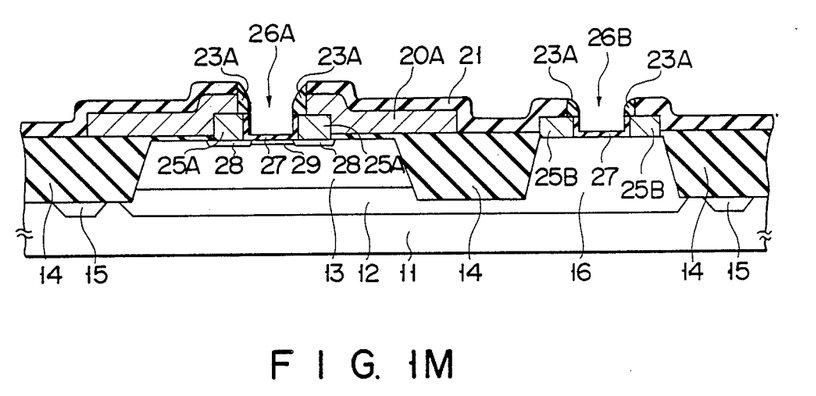

As shown in FIG. 1M, sixth SiO₂ films 27 each having a thickness of 500 Å are formed on the surfaces of the base contact portion 25A, the epitaxial-Si layer 13 and the collector outputting region 16 each exposed in the openings 26A and 26B using, e.g., thermal oxidation. At this time, boron ions contained in the base electrode pattern 20A are diffused in the epitaxial-Si layer 13 through the base contact portion 25A by heat generated during thermal oxidation. Therefore, a p⁺-type outer base region 28 is formed in the epitaxial-Si layer 13. Boron (B) ions are selectively implanted in the epitaxial-Si layer 13 through the sixth SiO₂ film 27 near the opening 26A and diffused to form a p⁻-type inner base region 29. In this embodiment, ion implantation is performed on practical conditions having an acceleration energy of 20 keV and a dose of $5 \times 10^{13}$ cm⁻². Conditions of the ion implantation are not limited to the above values. These values are controlled to be optimal in consideration of the thickness of the sixth SiO₂ film 27 and desired characteristics of elements.

Note that ion implantation for forming the inner base region 29 may be performed before forming the sixth SiO₂ film 27.

Figure 1N:
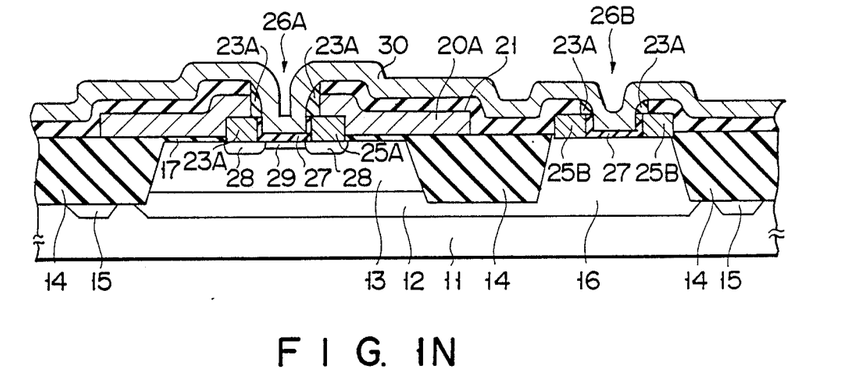

As shown in FIG. 1N, a fourth poly-Si film 30 having a thickness of about 2,000 Å is formed over the entire surface of the substrate using, e.g., CVD. The fourth poly-Si film 30 is formed to prospectively control a size of a interval between the base contact portion 25A and an emitter electrode. Therefore, the thickness of the fourth poly-Si film 30 is not limited to the above value, and controlled to be optimal in consideration of processing accuracy in sequential etching steps and desired characteristics of elements. In this embodiment, the poly-Si film 30 has a thickness of about 2,000 Å. As a result, the interval between base contact portion 25A and the emitter electrode becomes about 2,500 Å which is a sum of this film thickness of about 2,000 Å and the thickness of 500 Å of the sixth SiO₂ film 27.

Figure 1O:
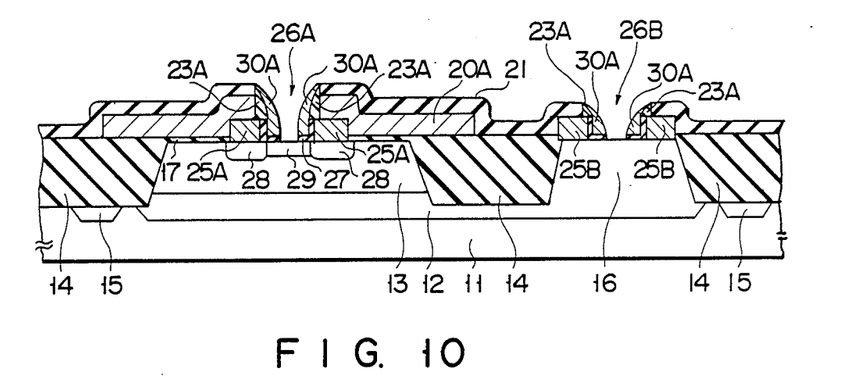

As shown in FIG. 1O, the fourth poly-Si film 30 is etched back to form side walls 30A made of the fourth poly-Si film 30 around each side wall of openings 26A and 26B. The sixth SiO₂ film 27 exposed in the opening 26A is etched to expose the inner base region 29. At the same time, the sixth SiO₂ film 27 exposed in the opening 26B is etched to expose the collector outputting region 16.

Figure 1P:
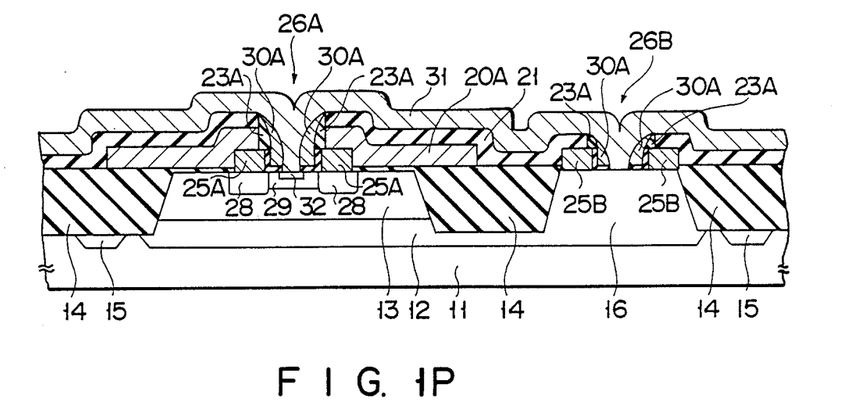

As shown in FIG. 1P, a fifth poly-Si film 31 is formed over the entire surface of the substrate using, e.g., CVD. Arsenic (As) ions are selectively implanted in the fifth poly-Si film 31 and diffused to form an emitter region 32 in the inner base region 29. In this embodiment, ion implantation are performed on practical conditions having an acceleration energy of 50 keV and a dose of $\times 10^{16}$ cm⁻². Conditions of the ion implantation are not limited to the above values. These values are controlled to be optimal in consideration of the thickness of the fifth poly-Si film 31 and desired characteristics of elements.

When arsenic (As) ions are implanted in the fifth poly-Si film 31 so that the fifth poly-Si film 31 has a high impurity concentration, the formed element can have a desired gain by short-period annealing. Therefore, a SST bipolar transistor having a high cutoff frequency can be obtained. However, when the sixth poly-Si film 31 has a high impurity concentration, crystal defects are easily formed at the peripheral portion of the prospective emitter forming region. Therefore, the emitter region 32, in particularly, the major surface of the epitaxial-Si layer 13 desirably has an impurity concentration controlled to be $5 \times 10^{20}$ cm$^3$ or less.

Note that the ion implantation for forming the emitter region 32 may be performed before forming the poly-Si film 31, and ions may be implanted in the fourth poly-Si film 30 described in the step in FIG. 1N in advance.

The outer base region 28, the inner base region 29 and emitter region 32 are activated by annealing.

Figure 1Q:
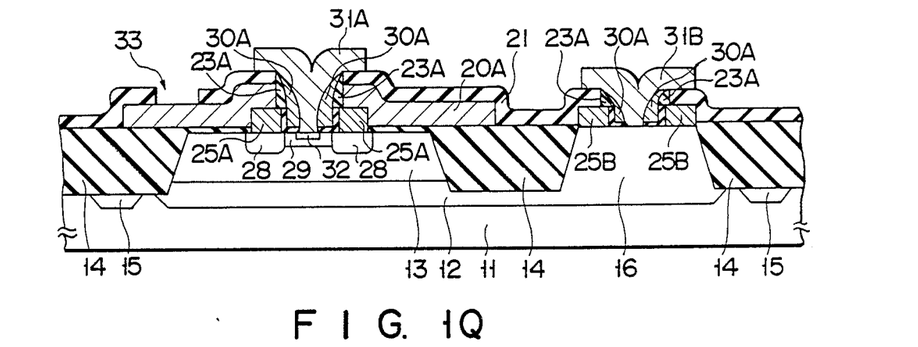

As shown in FIG. 1Q, the sixth poly-Si film 31 is patterned using lithographic techniques to form an emitter electrode pattern 31A and a collector electrode pattern 31B. A contact hole 33 which reaches a base electrode pattern 21A through the fourth SiO$_2$ film 21 using lithographic techniques is formed.

Figure 1R:
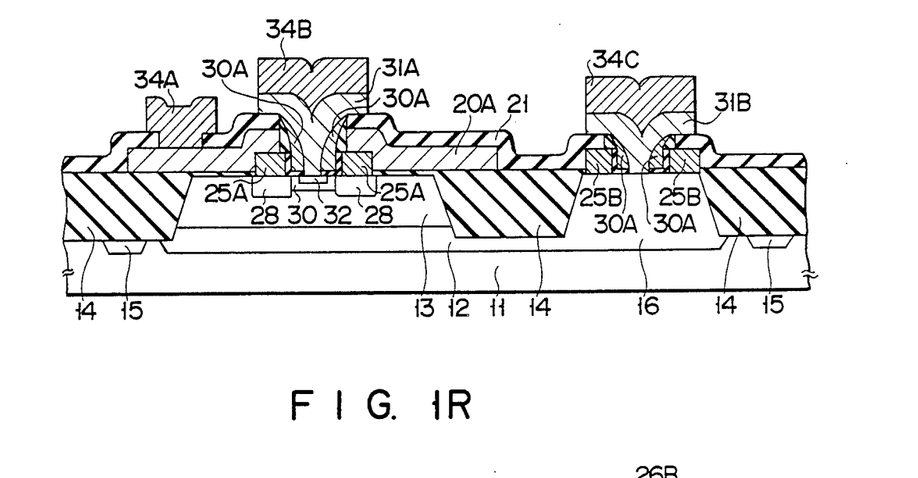

As shown in FIG. 1R, a metal film made of aluminum or the like is formed over the entire surface of the substrate using, e.g., sputtering. The metal film is patterned using lithographic techniques to form a base inter connection layer 34A, an emitter inter connection layer 34B and a collector inter connection layer 34C. An SST bipolar transistor is completed by these manufacturing steps.

According to the manufacturing method of the first embodiment, the size of the base region on the major surface of the epitaxial-Si layer 13 can be defined by the size of the spacer film pattern 18A. As a result, the size of the base region on the major surface of the epitaxial-Si layer 13 is stable. Therefore, in the SST bipolar transistor manufactured by the manufacturing method according to the first embodiment, the size of the base region can be uniformed, thereby decreasing variations in characteristic of elements.

When the spacer film pattern 18A is made of the poly-Si film 18, its etching can be performed using the SiO$_2$ films 17. 19, 21 and 23A as etching masks. For this reason, dry etching can be performed using a chlorine gas or a gas mixture of fluorine (F) and chlorine (Cl). Therefore, bubbles which are generated by wet etching are not generated, and production probability of SST bipolar transistors, i.e., a yield of elements, can be increased. In the manufacturing method of the present invention, the production probability of elements can be increased from about 99.999% to 99.9999%. Therefore, a semiconductor device on which a large number of 10,000 or more SST bipolar transistors are integrated can be provided, and it is very inexpensive.

Note that, in the manufacturing method of this embodiment, the spacer film pattern 18B is also formed in the collector outputting region 16. Therefore, the steps executed particularly on the collector outputting region 16 can be simultaneously performed with the steps executed on the epitaxial-Si layer 13 as much as possible. The redundant steps can be omitted, thereby simplifying the process. [EMBODIMENT 2]

A method of manufacturing an SST bipolar transistor according to the second embodiment of the present invention will be described with reference to FIGS. 2A to 2D. Note that the same reference numerals as in FIGS. 2A to 2D denote the same parts in FIGS. 1A to 1R, and only different parts will be described.

Figure 2A:
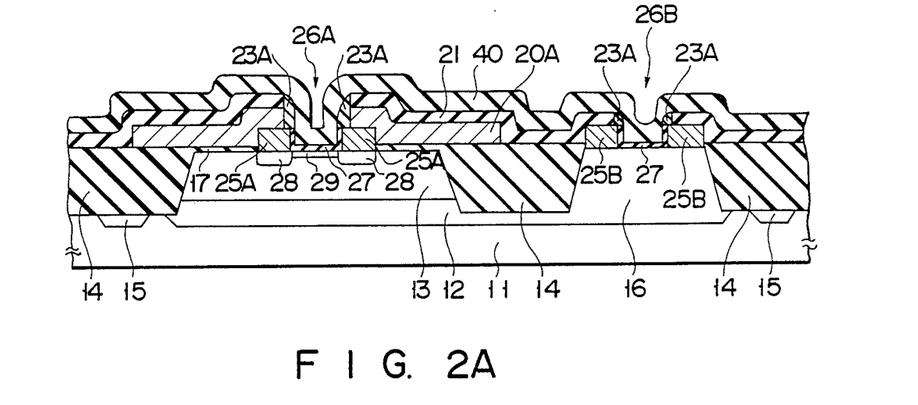
FIGS. 2A to 2D are sectional views showing sequential steps in manufacturing an SST bipolar transistor according to the second embodiment of the present invention.

After completion of the steps in FIGS. 1A to 1M, as shown in FIG. 2A, an SiO$_2$ film 40 having a thickness of about 2,000 Å is formed over the entire surface of the resultant structure using, e.g., CVD. This SiO$_2$ film 40 is prospectively used for controlling the size of an interval between a base contact portion 25A and an emitter electrode. Therefore, the thickness of the SiO$_2$ film 40 is not limited to the above value and controlled to be optimal in consideration of processing accuracy in sequential etching steps and desired characteristics of elements.

Figure 2B:
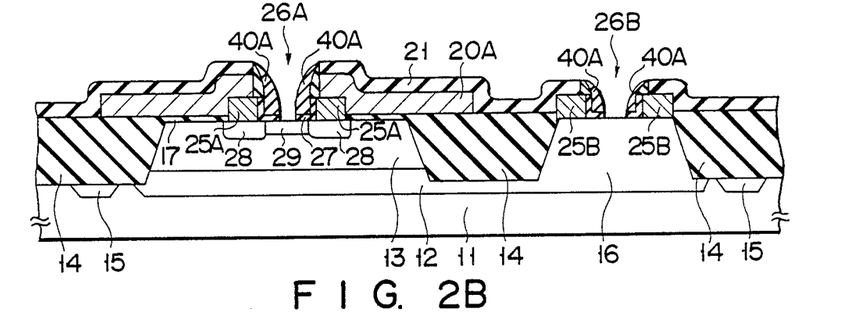

As shown in FIG. 2B, the SiO$_2$ film 40 is etched back using, e.g., RIE to form side walls 40A around side walls of openings 26A and 26B. At this time, the sixth SiO$_2$ film 27 exposed in the opening 26A is etched to expose an inner base region 29. At the same time, the sixth SiO$_2$ film 27 exposed in the opening 26B is etched to expose a collector outputting region 16.

Figure 2C:
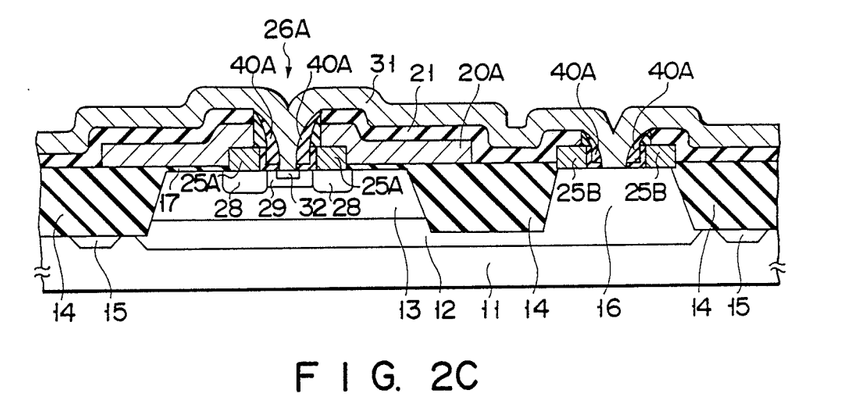

As shown in FIG. 2C, a fifth poly-Si film 31 is formed over the entire surface of the substrate using, e.g., CVD.

Figure 2D:
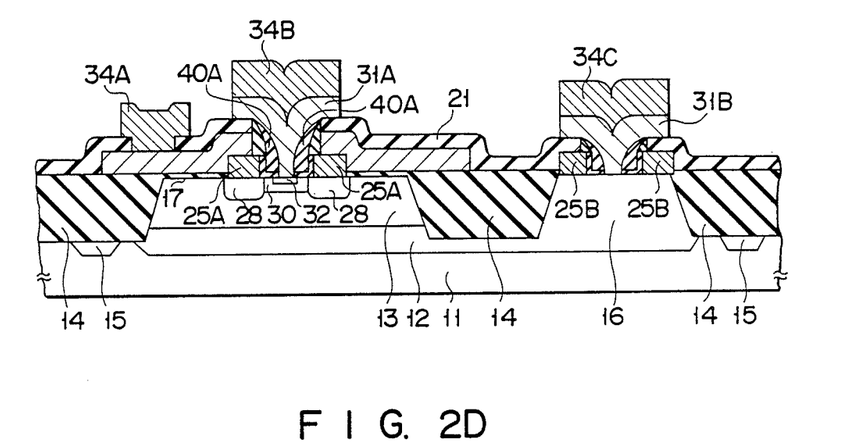

Subsequent steps are the same as those in FIGS. 1P to 1R. The finished SST transistor is shown in FIG. 2D.

Thus, when the SiO$_2$ film is used as a film for controlling the interval between the base contact portion 25A and the emitter electrode, the same effect described in the first embodiment can be obtained.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing an SST bipolar transistor comprising the steps of:
    (a) forming a first insulating film in an SST bipolar transistor forming region on the major surface of a semiconductor body of a first conductivity type;
    (b) forming a spacer film serving as a spacer on said first insulating film;
    (c) etching said spacer film to form a spacer film pattern having a predetermined size;
    (d) forming a second insulating film on said spacer film pattern;
    (e) forming a first conductive film of a second conductivity type over the entire surface of said semiconductor body;
    (f) etching said first conductive film to form a first conductive film pattern larger than said spacer film pattern above said spacer film pattern;
    (g) forming a third insulating film over the entire surface of said semiconductor body;
    (h) forming a first opening which reaches said spacer film pattern through said third insulating film, said first conductive film pattern and said second insulating film;
    (i) forming a fourth insulating film over the entire surface of said semiconductor body;
    (j) etching said fourth insulating film to form a first side wall constituted by said fourth insulating film around the side wall of said first opening;
    (k) etching said spacer film pattern from said first opening to form a second opening communicating with said first opening and having a diameter larger than said first opening;

(l) etching said first and second insulating films from said first opening to expose parts of said first conductive film and the major surface to the inside of said second opening;

(m) forming second conductive film over the entire surface said semiconductor body including the inside of said second opening;

(n) etching a part of said second conductive film to form a third opening which corresponds to said first opening and reaches the major surface of said semiconductor body;

(o) forming a fifth insulating film on said first and second conductive films and said major surface each exposing the inside of said third opening;

(p) implanting an impurity of the second conductivity type from said third opening into said semiconductor body;

(q) forming a third conductive film over the entire surface of said semiconductor body;

(r) etching said third conductive film to form a second side wall constituted by said third conductive film around the side wall of said third opening;

(s) forming a fourth conductive film of the first conductivity type over the entire surface of said semiconductor body;

(t) activating base and emitter regions in said semiconductor body corresponding to said second opening;

(u) etching said fourth conductive film to form an emitter electrode pattern;

(v) forming a fourth opening which reaches said first conductive film through said third insulating film;

(w) forming a fifth conductive film over the entire surface of said semiconductor body; and (x) etching said fifth conductive film to form interconnection layers.

2. A method according to claim 1, wherein said spacer film is constituted by an Si film.

3. A method according to claim 2, wherein said Si film is made of polycrystalline silicon.

4. A method according to claim 2, wherein said Si film is made of amorphous silicon.

5. A method according to claim 1, wherein the step (j) is executed by performing dry etching.

6. A method according to claim 1, wherein, after step (i) an annealing step of densifying said first side wall is inserted.

7. A method according to claim 1, wherein said third conductive film is constituted by an insulating film.

* * * * *